(12) United States Patent
Lu et al.

(10) Patent No.: US 11,965,989 B2
(45) Date of Patent: Apr. 23, 2024

(54) COPACKAGING PHOTODETECTOR AND READOUT CIRCUIT FOR IMPROVED LIDAR DETECTION

(71) Applicant: BEIJING VOYAGER TECHNOLOGY CO., LTD., Beijing (CN)

(72) Inventors: Yue Lu, Mountain View, CA (US); Vipul Chawla, Mountain View, CA (US); Youmin Wang, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 832 days.

(21) Appl. No.: 17/089,715

(22) Filed: Nov. 4, 2020

(65) Prior Publication Data

US 2022/0137191 A1 May 5, 2022

(51) Int. Cl.
| | | |
|---|---|---|
| *G01S 7/48* | (2006.01) | |
| *G01S 7/4863* | (2020.01) | |
| *G01S 17/89* | (2020.01) | |
| *H01L 25/04* | (2023.01) | |
| *H01L 31/107* | (2006.01) | |

(52) U.S. Cl.
CPC ............ *G01S 7/4863* (2013.01); *G01S 17/89* (2013.01); *H01L 25/042* (2013.01); *H01L 25/043* (2013.01); *H01L 31/107* (2013.01)

(58) Field of Classification Search
USPC ........................................................ 356/5.01
See application file for complete search history.

(56) References Cited

U.S. PATENT DOCUMENTS

| 11,408,983 B2* | 8/2022 | Kirillov | ................ G01S 17/14 |
| 11,726,184 B2* | 8/2023 | Ferreira | ................ G01S 7/4815 |
| | | | 356/4.01 |
| 2011/0255072 A1 | 10/2011 | Griffis et al. | |
| 2019/0237609 A1* | 8/2019 | Onal | ................ G01S 17/89 |

(Continued)

OTHER PUBLICATIONS

Nieweglowski, Krzysztof, et al. "Electro-optical integration for VCSEL-based board-level optical chip-to-chip communication." Optical Fibers and Their Applications 2017. vol. 10325. SPIE. (Year: 2017).*

(Continued)

*Primary Examiner* — James R Hulka
(74) *Attorney, Agent, or Firm* — BAYES PLLC

(57) ABSTRACT

Embodiments of the disclosure provide an optical sensing system and an optical sensing method thereof. The optical sensing system comprises a light source configured to emit an optical signal into an environment surrounding the optical sensing system. The optical sensing system further comprises a photodetector configured to receive the optical signal reflected from the environment of the optical sensing system, and convert the optical signal to an electrical signal, where the photodetector is disposed in a package. The optical sensing system additionally comprises a readout circuit configured to generate a readout signal based on the electrical signal received from the photodetector, where the readout circuit is disposed in the same package as the photodetector and connected to the photodetector through routings in the package.

14 Claims, 9 Drawing Sheets

(56) References Cited

U.S. PATENT DOCUMENTS

2020/0103507 A1 4/2020 Kirillov et al.
2020/0284883 A1 9/2020 Ferreira et al.
2022/0179050 A1* 6/2022 Lu .......................... G01S 7/4813

OTHER PUBLICATIONS

International Search Report issued in corresponding International Application No. PCT/US2021/055685, dated Feb. 11, 2022, 4 pages.
Written Opinion of the International Searching Authority issued in corresponding International Application No. PCT/US2021/055685, dated Feb. 11, 2022, 5 pages.

* cited by examiner

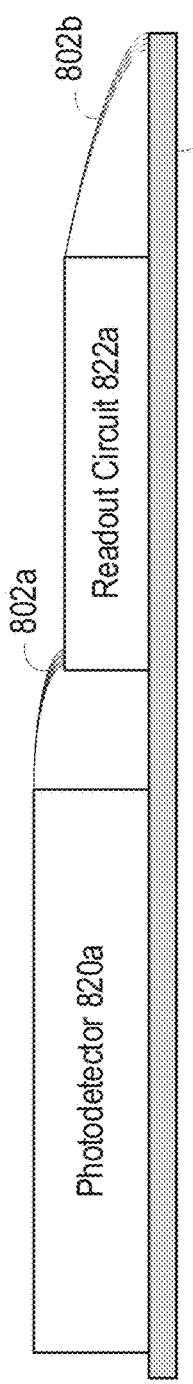 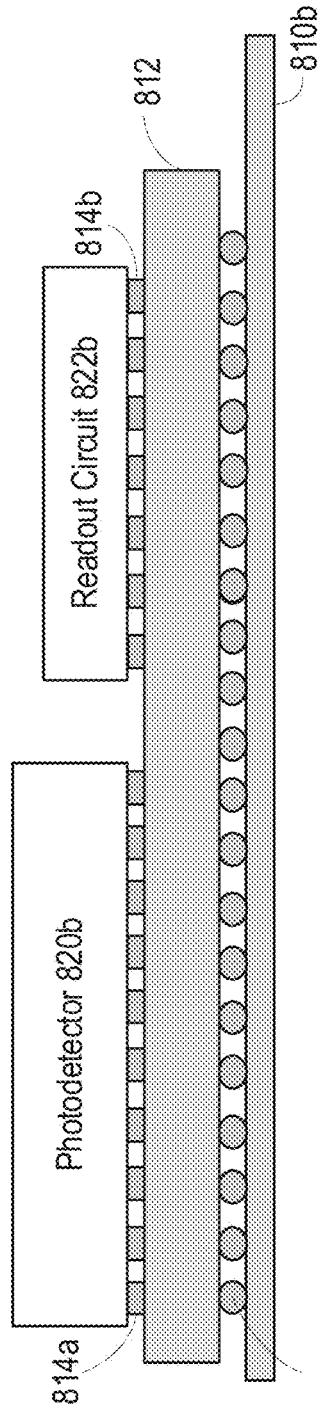 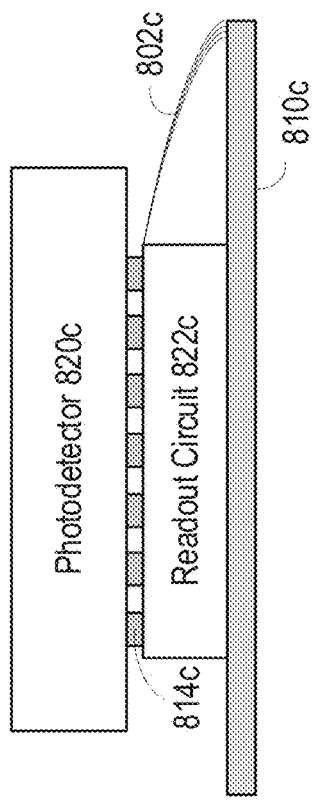
FIG. 8A
FIG. 8B
FIG. 8C

COPACKAGING PHOTODETECTOR AND READOUT CIRCUIT FOR IMPROVED LIDAR DETECTION

TECHNICAL FIELD

The present disclosure relates to a light detection and ranging system (LiDAR), and more particularly to, a copackaged photodetector and readout circuit in a LiDAR system for improved signal detection.

BACKGROUND

In a LiDAR system, reducing the noise at the optical signal receiver frontend is the key to improve the detection performance such as the detection distance and accuracy of the system. A receiver frontend is generally composed of a photodetector such as an Avalanche Photodetector (APD) and a readout circuit such as a Trans-impedance Amplifier (TIA). Conventionally, an APD and a TIA are separately packaged chips (i.e. each chip contains one type of die), which are then connected on a Printed Circuit Board (PCB) through copper traces. These copper traces generally add a good amount of parasitic capacitance and inductance, which unavoidably degrade the overall performance of a LiDAR system. In addition, for a multi-channel APD/TIA design that includes a plurality of APDs/TIAs in the system, the lengths and electrical properties of these copper traces are difficult to match each other due to the large routing area of these copper traces on a PCB. This then further degrades the overall system performance, including but not limited to detection (e.g., gain and bandwidth) mismatches among different channels.

Embodiments of the disclosure improve signal detection of a LiDAR system by copackaging one or more photodetectors and one or more readout circuits in a same package

SUMMARY

Embodiments of the disclosure provide an optical sensing system with a copackaged receiver frontend. The disclosed optical sensing system includes a light source configured to emit an optical signal into an environment surrounding the optical sensing system. The optical sensing system further includes a photodetector configured to receive the optical signal reflected from the environment of the optical sensing system, and convert the optical signal to an electrical signal, where the photodetector is disposed in a package The optical sensing system additionally includes a readout circuit configured to generate a readout signal based on the electrical signal received from the photodetector, where the readout circuit is disposed in the same package as the photodetector and connected to the photodetector through routings in the package.

Embodiments of the disclosure also provide an optical sensing method for an optical sensing system. The optical sensing method includes emitting, by a light source of the optical sensing system, an optical signal into an environment surrounding the optical sensing system. The optical sensing method further includes receiving, by a photodetector of the optical sensing system, the optical signal reflected from the environment surrounding the optical sensing system, where the photodetector is disposed in a package. The optical sensing method additionally includes generating, by a readout circuit of the optical sensing system, a readout signal based on the electrical signal received from the photodetector, where the readout circuit is disposed in the same package as the photodetector and connected to the photodetector through routings in the package.

Embodiments of the disclosure additionally provide a copackaged frontend of a receiver for an optical sensing system. The copackaged frontend of the receiver includes a photodetector configured to receive an optical signal and convert the optical signal to an electrical signal, and a readout circuit configured to generate a readout signal based on the electrical signal received from the photodetector. In the copackaged frontend, the photodetector and the readout circuit are disposed in a same package and the photodetector is connected to the readout circuit through routings in the package.

It is to be understood that both the foregoing general description and the following detailed description are exemplary and explanatory only and are not restrictive of the invention, as claimed.

BRIEF DESCRIPTION OF THE DRAWINGS

FIGS. 8A-8C illustrate exemplary 2D, 2.5D, and 3D structures of photodetector and readout circuit integration within a copackaged frontend, according to embodiments of the present disclosure.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Embodiments of the present disclosure provide systems and methods for improved signal detection in a LiDAR system with a copackaged frontend. The copackaged frontend may be a compact package that includes one or more photodetectors and one or more readout circuits copackaged in the same package. Due to the copackaging design, the photodetector(s) and the readout circuit(s) may be then directly connected through one or more bonding wires in the package without involving any intermediate pad, or connected through other routings that minimize or shorten the connection lengths in the package. By shortening the length of bonding wires and the other routings as much as possible, parasitic capacitance and inductance and thus the overall noise of the LiDAR system can be reduced.

In addition, for the multi-channel photodetector/readout circuit design that includes a plurality of photodetectors and readout circuits in the system, due to the copackaging design in a single package, the plurality of photodetectors and readout circuits can be tightly controlled in the alignment to reduce routing mismatches between different channels, thereby avoiding the problem of routing mismatch and thus the detection (e.g., gain and bandwidth) mismatch among different channels.

The improved LiDAR signal detection system can be used in many applications. For example, the improved signal detection system can be used in advanced navigation technologies, such as to aid autonomous driving or to generate high-definition maps, in which the optical sensing system can be equipped on a vehicle.

Figure 1:
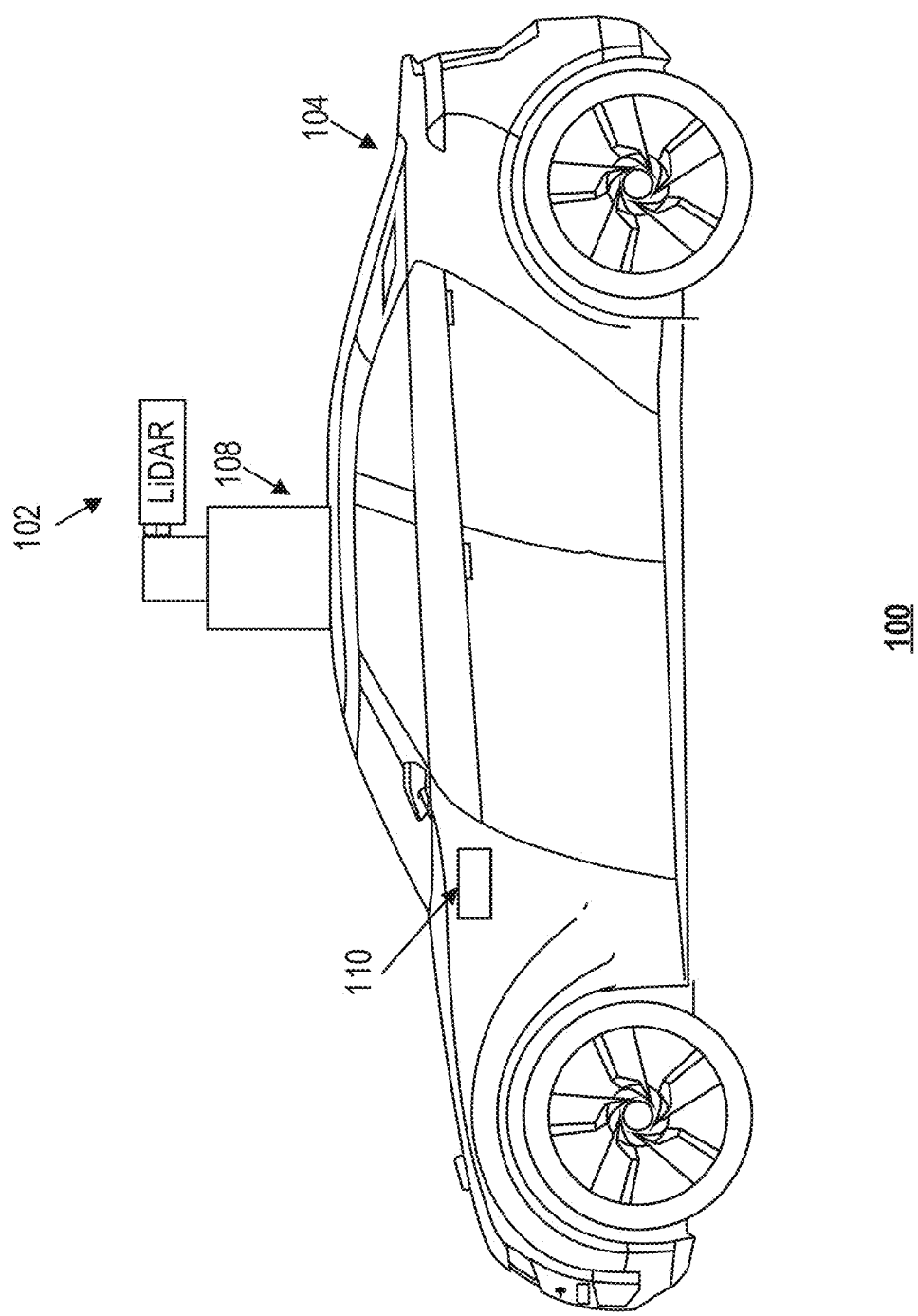
FIG. 1 illustrates a schematic diagram of an exemplary vehicle equipped with a LiDAR system, according to embodiments of the disclosure.

FIG. 1 illustrates a schematic diagram of an exemplary vehicle 100 equipped with an optical sensing system (e.g., a LiDAR system) 102 (hereinafter also referred to as LiDAR system 102), according to embodiments of the disclosure. Consistent with some embodiments, vehicle 100 may be a survey vehicle configured for acquiring data for constructing a high-definition map or 3-D buildings and city modeling. Vehicle 100 may also be an autonomous driving vehicle.

As illustrated in FIG. 1, vehicle 100 may be equipped with LiDAR system 102 mounted to a body 104 via a mounting structure 108. Mounting structure 108 may be an electro-mechanical device installed or otherwise attached to body 104 of vehicle 100. In some embodiments of the present disclosure, mounting structure 108 may use screws, adhesives, or another mounting mechanism. Vehicle 100 may be additionally equipped with a sensor 110 inside or outside body 104 using any suitable mounting mechanisms. Sensor 110 may include sensors used in a navigation unit, such as a Global Positioning System (GPS) receiver and one or more Inertial Measurement Unit (IMU) sensors. It is contemplated that the manners in which LiDAR system 102 or sensor 110 can be equipped on vehicle 100 are not limited by the example shown in FIG. 1 and may be modified depending on the types of LiDAR system 102 and sensor 110 and/or vehicle 100 to achieve desirable 3D sensing performance.

Consistent with some embodiments, LiDAR system 102 and sensor 110 may be configured to capture data as vehicle 100 moves along a trajectory. For example, a transmitter of LiDAR system 102 may be configured to scan the surrounding environment. LiDAR system 102 measures distance to a target by illuminating the target with pulsed or Continuous Wave (CW) laser beams and measuring the reflected/scattered pulses with a receiver. The laser beams used for LiDAR system 102 may be ultraviolet, visible, or near-infrared. In some embodiments of the present disclosure, LiDAR system 102 may capture point clouds including depth information of the objects in the surrounding environment. As vehicle 100 moves along the trajectory, LiDAR system 102 may continuously capture data. Each set of scene data captured at a certain time range is known as a data frame, which can be then used in constructing a dynamic high-definition map or 3-D buildings and city modeling.

Figure 2:
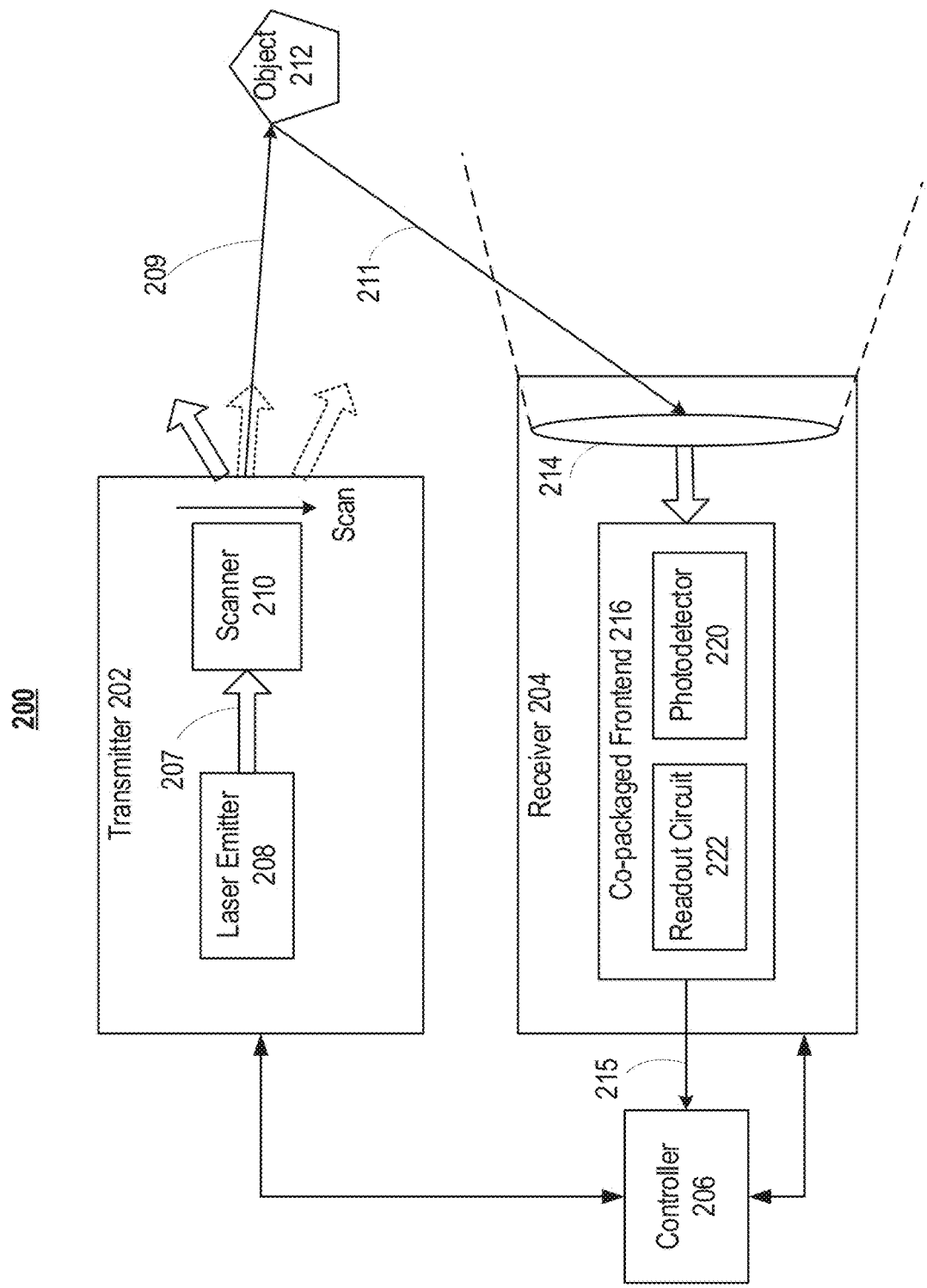
FIG. 2 illustrates a block diagram of an exemplary LiDAR system, according to embodiments of the disclosure.

FIG. 2 illustrates a block diagram of an exemplary LiDAR system 102, according to embodiments of the disclosure. LiDAR system 102 may include a transmitter 202, a receiver 204, and a controller 206. Transmitter 202 may emit optical beams (e.g., pulsed or CW laser beams) along multiple directions. Transmitter 202 may include one or more laser sources (e.g., a laser emitter 208) and a scanner 210.

Transmitter 202 can sequentially emit a stream of pulsed or CW laser beams in different directions within a scan Filed-of-View (FOV) (e.g., a range in angular degrees), as illustrated in FIG. 2.

Laser emitter 208 may be configured to provide laser beams 207 (also referred to as "native laser beams") to scanner 210. In some embodiments of the present disclosure, laser emitter 208 may generate laser beams (e.g., pulsed or CW) in the ultraviolet, visible, or near-infrared wavelength range. In some embodiments of the present disclosure, laser emitter 208 may include a Pulsed Laser Diode (PLD), a CW laser diode, a Vertical-Cavity Surface-Emitting Laser (VCSEL), a fiber laser, etc. For example, a pulsed or CW laser diode may be a semiconductor device similar to a Light-Emitting Diode (LED) in which the laser beam is created at the diode's junction. In some embodiments of the present disclosure, a PLD includes a PIN (p-i-n) diode in which the active region is in the intrinsic (I) region, and the carriers (electrons and holes) are pumped into the active region from the N and P regions, respectively. Depending on the semiconductor materials of laser diodes, the wavelength of incident laser beams 207 provided by a laser diode may be at different values, such as 405 nm, between 445 nm and 465 nm, between 516 nm and 525 nm, 532 nm, 635 nm, between 650 nm and 660 nm, 670 nm, 760 nm, 785 nm, 808 nm, 848 nm, or 905 nm, 940 nm, 980 nm, 1064 nm, 1083 nm, 1310 nm, 1370 nm, 1550 nm, 1625 nm, 1650 nm, 1940 nm, 2000 nm, etc. It is understood that any suitable laser emitter may be used as laser emitter 208 for emitting laser beams 207.

Scanner 210 may be configured to emit laser beams 209 to an object 212 in a range of detection angles (collectively forming the FOV of transmitter 202). In some embodiments, scanner 210 may also include optical components (e.g., lenses, mirrors) that can collimate laser light into a narrow laser beam to increase the scan resolution and the range to scan object 212. In some embodiments, object 212 may be made of a wide range of materials including, for example, non-metallic objects, rocks, rain, chemical compounds, aerosols, clouds, and even single molecules. In some embodiments, at each time point during the scan, scanner 210 may emit laser beams 209 to object 212 in a direction within a range of scanning angles by rotating a deflector, such as a micromachined mirror assembly.

In some embodiments, receiver 204 may be configured to detect laser beams 211 returned from object 212. Returned laser beams 211 may be in a different direction from laser beams 209. As the multiple pulses in laser beam 209 reach object 212 at different times, they are reflected by object 212 sequentially. Accordingly, laser beams 211 may also include multiple return pulses separated by the predetermined time delay. Receiver 204 can collect laser beams returned from object 212 and output signals reflecting the intensity of the returned laser beams. Upon contact, laser light can be reflected/scattered by object 212 via backscattering, such as Rayleigh scattering, Mie scattering, Raman scattering, and fluorescence.

As illustrated in FIG. 2, receiver 204 may include a lens 214 and a copackaged frontend 216. Lens 214 may be configured to collect light from a respective direction in the receiver FOV and converge the returned laser beams to focus on copackaged frontend 216. At each time point during the scan, returned laser beams 211 may be collected by lens 214. Returned laser beams 211 may be returned from object 212. The pulses in returned laser beam 211 may have the same waveform (e.g., bandwidth and wavelength) as those in laser beams 209.

Copackaged frontend 216 may be configured to detect returned laser beams 211 returned from object 212 and converged by lens 214, and convert the detected signal to a signal (e.g., a digital signal) that is readable by controller 206. In the exemplary embodiments in FIG. 2, copackaged frontend 216 may include a photodetector 220 and a readout circuit 222. However, the present disclosure is not limited to such configuration, and other configurations for copackaged frontend 216 are also contemplated.

Photodetector 220 may convert the reflected optical signal (e.g., returned laser beams 211) converged by lens 214 into an electrical signal. To achieve this, photodetector 220 may include one or more photodiodes or other photosensors that generate a current or voltage proportional to the light that strikes their active areas. Depending on the configurations, different types of photodetector 220 may be included in copackaged frontend 216 of receiver 204. For instance, photodetector 216 may be a PIN detector, an APD detector, a Single Photon Avalanche Diode (SPAD) detector, a Silicon Photo Multiplier (SiPM) detector, or the like.

Readout circuit 222 may convert electrical signals received from photodetector 220 into a signal readable by controller 206. Depending on the configurations, readout circuit 222 may include one or more of a TIA, an Analog-to-Digital Converter (ADC), a Time-to-Digital Converter (TDC), and the like. In one example, readout circuit 222 may include a TIA, which converts an electrical current signal detected from photodetector 220 into a voltage signal, which may be readable by controller 206 that itself comprises a built-in ADC. Alternatively, readout circuit 222 may include both a TIA and an ADC or include both a TIA and a TDC. In some embodiments, readout circuit 222 may include only an ADC/TDC without including any TIA. For instance, an on-chip ADC may digitize the accumulated electrical signal directly without being through a TIA, especially when the accumulated electrical signal output from photodetector 220 is already amplified and/or filtered. In some embodiments, readout circuit 222 may include one or more additional components (e.g., a comparator), and the present disclosure is not limited to what component(s) is included in each readout circuit 222.

As discussed elsewhere herein and as illustrated in the figure, photodetector 220 and readout circuit 222 in the disclosed embodiments are copackaged in a same package (e.g., on a same carrier substrate). This differs significantly from other existing LiDAR systems, in which a photosensor and a readout circuit are configured as separately packaged chips that are connected on a PCB through copper traces. More details regarding copackaged frontend 216 of receiver 204 are described with respect to FIGS. 3-7.

Controller 206 may process and analyze signal 215 transmitted from readout circuit 222. For example, controller 206 in LiDAR system 102 may include a processor to determine the distance of object 212 from LiDAR system 102 based on digital signal 215 and data of laser beams 209. Controller 206 may further construct a high-definition map or 3-D buildings and city modeling surrounding LiDAR system 102.

In some embodiments, controller 206 may be configured to also control transmitter 202 and/or receiver 204 to perform detection/sensing operations. For instance, controller 206 may control laser emitter 208 to emit laser beams 207. In some embodiments, controller 206 may further control scanner 210 to emit laser beams 209.

In some alternative embodiments, digital signal 215 may be transmitted to and processed by a separate signal processor at a different location but communicating with controller 206 through a network (not shown). For example, the separate signal processor may be in a cloud or may be alternatively in a single location (such as inside a mobile device) or distributed locations.

From the above, it can be seen that compared to other existing optical sensing systems, the disclosed LiDAR system 102 includes a copackaged receiver frontend that copackages photodetector 220 and readout circuit 222 in a single package. The disclosed design may allow bonding wires connecting photodetector 220 and readout circuit 222 to be better aligned and allow direct connection between photodetector 220 and readout circuit 222, which can greatly reduce signal noise introduced by the inherent structure of receiver 204 as well as routing mismatch among multiple channels, as further described below. A detailed description of an exemplary copackaged receiver frontend will be illustrated hereinafter with reference to FIGS. 3-7.

Figure 3:
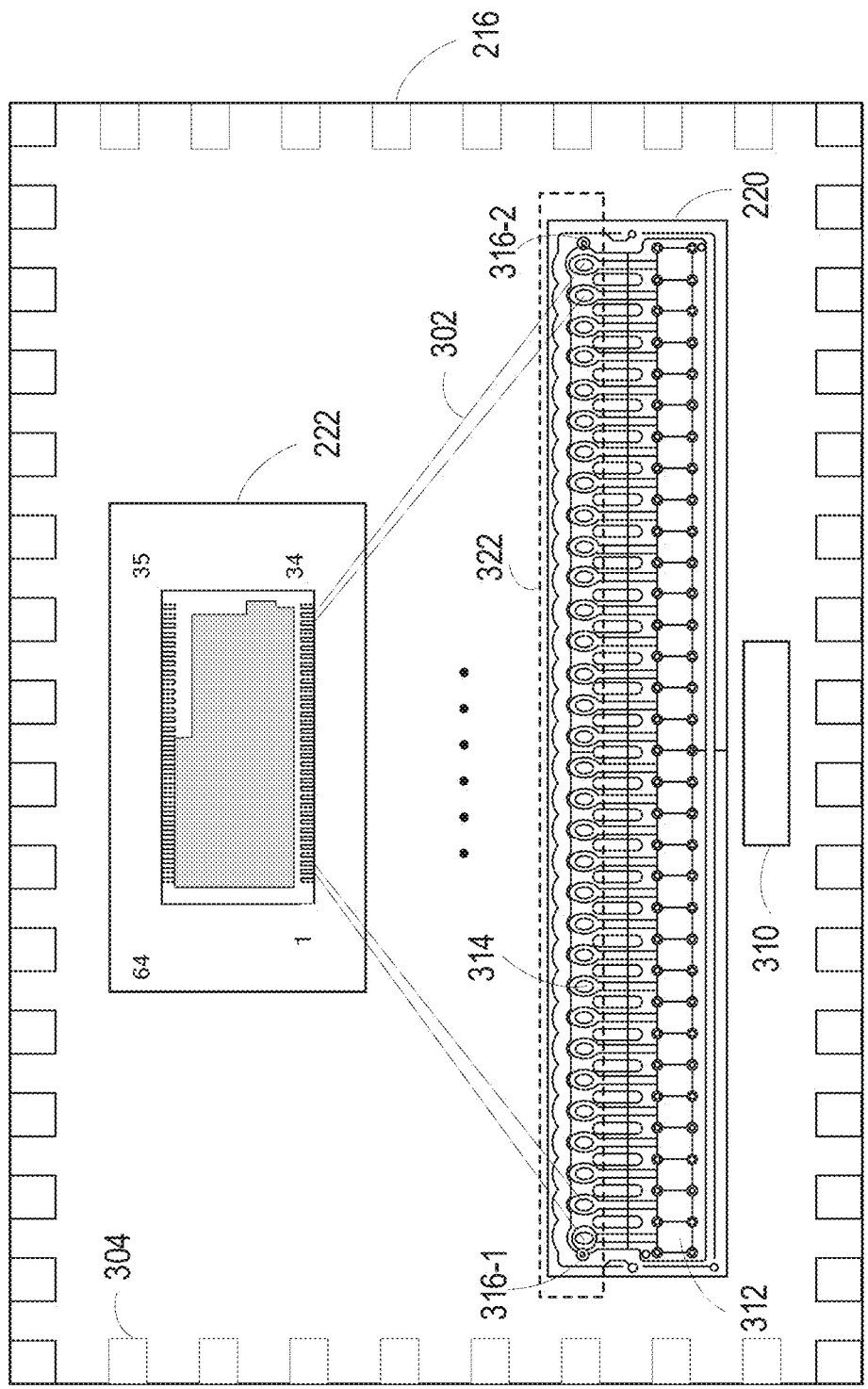
FIG. 3 illustrates a schematic diagram of an exemplary copackaged frontend of a receiver, according to embodiments of the disclosure.

FIG. 3 illustrates a schematic diagram of an exemplary copackaged frontend of a receiver, according to embodiments of the disclosure. As illustrated in FIG. 3, copackaged frontend 216 may include photodetector 220, readout circuit 222, and one or more bonding wires 302 directly connecting photodetector 220 with readout circuit 222. In addition, copackaged frontend 216 may include one or more pins 304 disposed on the substrate of copackaged frontend 216. The substrate may be composed of different materials, such as silicon, ceramic, FR4 (flame retardant 4), etc. Pins 304 may set up connections between different components within LiDAR system 102. For instance, these pins 304 may be configured for connection between different internal components (e.g., between photodetector 220 and readout circuit 222) on copackaged frontend 216, or configured for connection with other external components (e.g., controller 206) in LiDAR system 102.

In some embodiments, photodetector 220 may include a plurality of photosensing elements organized in an array. For instance, as illustrated in the figure, there may be 32 photosensors (may also be referred to as 32 channels) in photodetector 220. These photosensors may be any kind of photosensor (e.g., MPPC (multi-pixel photon counter), ADP, PIN, etc.) that can be applied for detecting reflected optical signals in a LiDAR system. Each photosensor in photodetector 220 may include a photoconductivity part 312 that senses the intensity of radiation striking the material and the corresponding transparent window that allows radiant energy to reach the junctions between the semiconductor materials inside the sensor. In addition, each photosensor may also include a bonding pad (e.g., circled bonding pad 314) for wire bonding to other components (e.g., readout circuit 222) in copackaged frontend 216.

Readout circuit 222 may also include a number of readout circuit units that correspond to the number of photosensing elements or photosensors in copackaged frontend 216. In other words, for each photosensor in photodetector 220, there may be a corresponding readout circuit unit for receiving and processing a signal output from that photosensor. For instance, although not clearly shown, there may exist 32 readout circuit units, in readout circuit 222, that correspond to 32 photosensors illustrated in FIG. 3.

In some embodiments, there may be fewer readout circuit units than photosensors. That is, one readout circuit unit may be shared by multiple photosensors and responsible for processing electrical signals output by the multiple photosensors. That is, multiple photosensors may output signals to a same readout circuit unit in readout circuit 222 for processing. At this point, readout circuit 222 may additionally include a corresponding switch (not shown) for establishing the connection between the readout circuit unit and the respective photosensors. The switch may connect to the multiple photosensors on one end and connect to the readout circuit unit on the other end. The switch then controls the processing of signals output from these multiple photosensors in the same readout circuit unit by switching to different photosensors at different time points.

As illustrated in the figure, copackaged frontend 216 also includes one or more bonding wires 302 for connecting photodetector 220 and readout circuit 222. These bonding wires may be composed of copper, gold, aluminum, or other proper materials. Detailed descriptions of these boding wires, including the bonding techniques and structure of these bonding wires, are provided in connection with FIGS. 4A-4B.

Besides the above-described components, copackaged frontend 216 may include additional components that facilitate the proper operation and organization of copackaged frontend 216. For instance, copackaged frontend 216 may include a certain number of bonding pads for connections between different internal components of copackaged frontend 216 and a certain number of package pads for connections with other external components of a LiDAR system. These bonding pads may have different shapes and structures. For instance, the bonding pads may include bonding pads on the package substrate, bonding pads for readout circuit 222, and bonding pads for photodetector 220, etc. Regarding bonding pads for readout circuit 222, these bonding pads may be located on two sides of readout circuit 222, one side facing photodetector 220 (i.e., the bottom side of readout circuit 222 in the figure) for wire bonding to photodetector 220, and the other side facing away from photodetector 220 (i.e., the top side of readout circuit 222 in the figure) for bonding to package pads for connections with other external components of LiDAR system 102. Regarding bonding pads for photodetector 220, they may be located on a side facing readout circuit 222 (as indicated by box 322), so that these bonding pads can be used for wire bonding to readout circuit 222. In FIG. 3, there are 32 circled bonding pads 314 in the photosensing elements. In addition, there are two bonding pads 316-1 and 316-2 located at two sides of photodetector 220 for connection to ground pins. Other bonding pads for different purposes may also be included in copackaged frontend 216, details of which are not specifically described here.

In some embodiments, copackaged frontend 216 may include one or more additional sensors that have different functions or purposes. For instance, there may exist one or more thermometers 310 for temperature sensing of photodetector 220 in copackaged frontend 216. Due to the compact design of multiple components in a same package, overheating may be a concern that requires careful monitoring and management. Thus, by introducing one or more thermometers 310, the temperature information of photodetector 220 may be forwarded to controller 206 or other components (not shown) in LiDAR system 102, to activate/deactivate a cooling system (e.g., a fan and the like), so that temperature of LiDAR system 102 can be properly controlled.

While not specifically illustrated in FIG. 3, copackaged frontend 216 may include a protection layer for the protection of copackaged frontend 216. The protection layer may include at least a portion of a transparent glass cover plate aligned on top of photodetector 220. The glass cover plate portion may have a proper thickness for both structure protection as well as allowing photodetector 220 to sense light returned from the environment. For instance, the glass over plate portion may have a thickness of 1 mm, 1.5 mm, or another proper value. In some embodiments, the whole cover plate of copackaged frontend 216 is a transparent glass lid, for both protection and light detection. In some embodiments, an optical filter may be used in lieu of glass to help filter out ambient light that is different than the laser wavelength return from objects. This may help reduce noise and thus further improve performance of the disclosed LiDAR system.

Other components (e.g., lead frames, epoxy, etc.) that may be included in copackaged frontend 216 are also contemplated, however, details of which will not specifically be provided here.

Figure 4A:
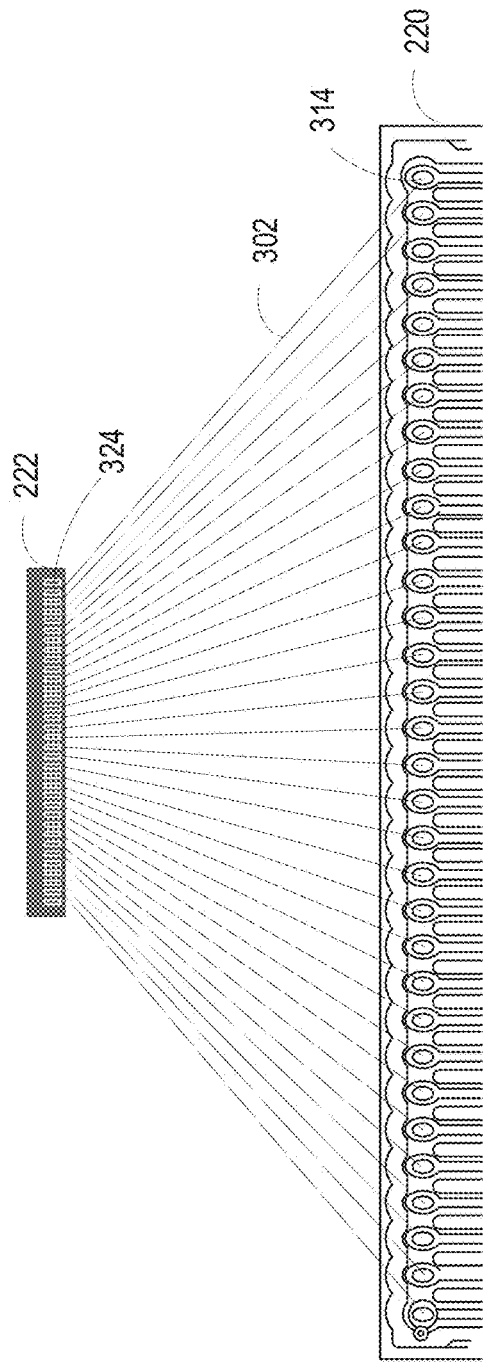
FIGS. 4A-4B illustrate schematic diagrams of exemplary bonding wires connecting a photodetector and a readout circuit in a copackaged frontend, according to embodiments of the disclosure.
Figure 4B:
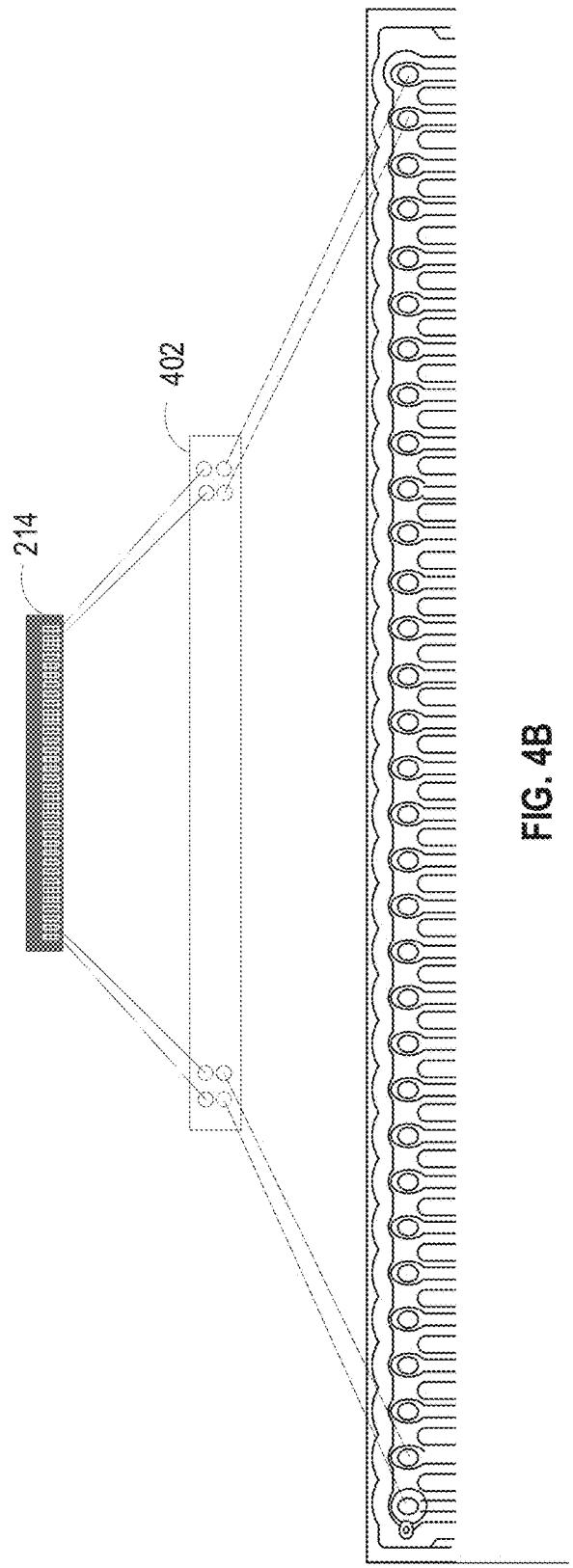

Referring now to FIGS. 4A-4B, more details regarding bonding wires for connecting photodetector 220 and readout circuit 222 will be described hereinafter. FIG. 4A illustrates a schematic diagram of exemplary bonding wires connecting photodetector 220 and readout circuit 222 in a copackaged frontend, according to embodiments of the disclosure.

In some embodiments, different wire bonding techniques may be applied here for facilitating direct wire bonding between photodetector 220 with readout circuit 222. These techniques may include ball bonding, wedge bonding, and compliant bonding that each may be restricted to different materials and employ different processes. For instance, ball bonding may be applied here by using gold or copper wires and with a certain amount of heat in wire bonding. Alternatively, wedge bonding may be applied here by using gold or copper, where the heat is not needed when copper is used for bonding. For either ball bonding or wedge bonding, bonding wires 302 are attached at both ends using a combination of downward pressure, ultrasonic energy, and in some cases heat, to make a weld. For compliant bonding, heat and pressure are transmitted through a compliant or indentable aluminum tape and therefore is applicable in bonding gold wires and beam leads that have been electroformed to the silicon integrated circuit. Other bonding techniques not described above for wire bonding are also contemplated.

By using these different wire bonding techniques, one end of each bonding wire 302 may be electrically bonded to a corresponding circled bonding pad 314 included in a photosensor, while the other end of each bonding wire 302 may be electrically bonded to a corresponding bond-pad 324 on a readout circuit unit. There is no other intermediate pad that a bonding wire needs to go through between circled bonding pad 314 of a photosensor and bond-pad 324 of a readout circuit unit, thereby forming a direct connection between photodetector 220 and readout circuit 222. Since there is no intermediate pad that a bonding wire needs to go through, the length of a bonding wire 302 can thus be shortened as much as possible, to minimize the length of bonding wire 302. In addition, because the array structure and the plurality of photosensors in photodetector 220 and the readout circuit units in readout circuit 222 are organized to be close and correspond to each other, the area for routing of these bonding wires is much smaller when compared to a PCB structure. As a result, the bonding wires may be also aligned well between photodetector 220 and readout circuit 222. This then minimizes channel mismatch or misalignment between different bonding wires 302. All these together will allow the parasitic inductance and capacitance in copackaged frontend 216 to be greatly reduced and routing mismatch to be minimized when compared to using PCB structures to organizing photodetectors and readout circuits. Therefore, the frontend bandwidth and noise performance of LiDAR system 102 can be greatly improved.

It is to be noted that while there are 32 photosensors are illustrated in FIGS. 3-4A, the number of photosensors in photodetector 220 is not limited to 32 here, and can be any other numbers in actual applications. For instance, there may be 24, 20, 12, 10, or another number of photosensors disposed in the photosensor array. Correspondingly, the number of readout circuit units in readout circuit 222 is also not limited to the illustrated number of 32, and can be any other numbers. In one example, the number of readout circuit units in readout circuit 222 is the same as the number of photosensors in photodetector 220. In this way, each photosensor will wire-bond to a corresponding readout circuit unit via a bonding wire. In some embodiments, the alignment of photosensors in a photodetector can also be changed. For instance, the photosensors in a photodetector may be aligned in two-dimensional array (2D array), but not just one-dimensional array (1D array) as shown in FIGS. 3-4A. Similarly, readout circuit units in a readout circuit may also be aligned in a 1D or 2D array, to match the alignment of the corresponding photosensors in photodetector.

In some embodiments, instead of directly connecting photodetector 220 to readout circuit 222, there may exist some intermediate pads (represented by a box 402) that mediate the wire bonding between photodetector 220 and readout circuit 222, as illustrated in FIG. 4B. Under certain circumstances, it may be challenging to directly wire-bond every photosensor in photodetector 220 to a corresponding readout circuit unit in readout circuit 222. For instance, if the size difference between photodetector 220 and readout circuit 222 is quite large (e.g., photodetector 220 is much larger than readout circuit 222), for some photosensors on the edges (i.e., close to two ends of photodetector 220), direct wire bonding may be challenging (due to the limited length of a bonding wire in a fabrication process or due to other limitations). At this moment, one or more intermediate pads may be set up between photodetector 220 and readout circuit 222, to facilitate wire bonding between the two components. In some embodiments, the connection of all channels will be mediated through the intermediate pads in box 402. In some embodiments, only a subset of channels will be mediated through the intermediate pads in box 402 in wire bonding.

As described above and as illustrated in FIGS. 3-4B, copackaged frontend 216 may include one photodetector 220 and one corresponding readout circuit 222 (together may be referred to as a "pair"). However, the present disclosure is not limited to such structure and organization.

Figure 5:
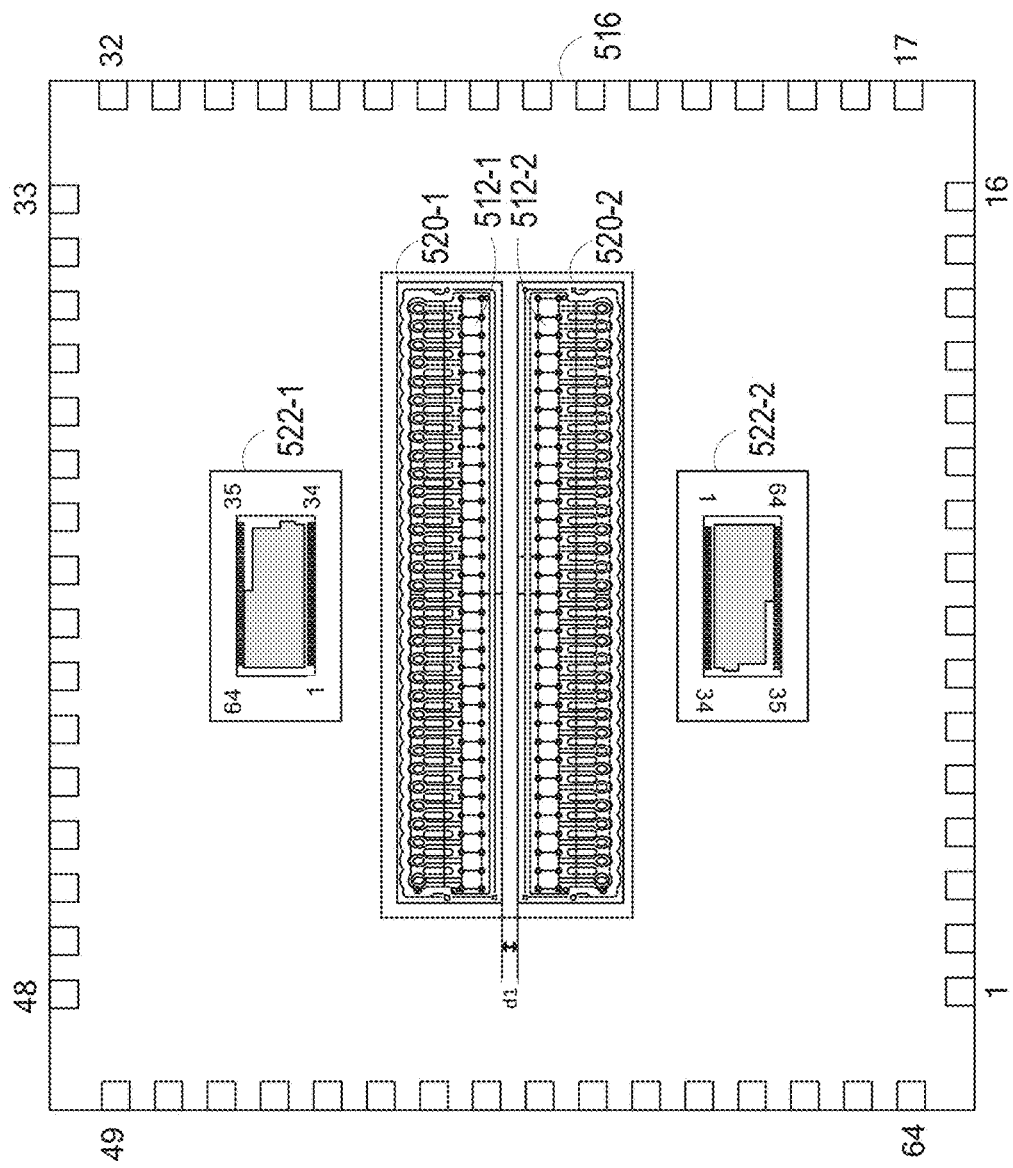
FIG. 5 illustrates a schematic diagram of another exemplary copackaged frontend of a receiver, according to embodiments of the disclosure.

FIG. 5 illustrates a schematic diagram of another exemplary copackaged frontend that includes multiple pairs of photodetectors and readout circuits, according to embodiments of the disclosure. As illustrated in the figure, copackaged frontend 516 may include two photodetectors (i.e., two arrays of photodetecting elements) 520-1 and 520-2, and two corresponding readout circuits 522-1 and 522-2. That is, there are two pairs of photodetectors and readout circuits in the illustrated copackaged frontend 516. In addition, copackaged frontend 516 may also include a plurality of pins for internal and external connections. For example, copackaged frontend 516 may include 64 pins on the edges of the package substrate.

The advantage of using two pairs of photodetectors and readout circuits in the copackaged frontend includes that such receiver frontend may allow simultaneously detecting two sources of reflected light. For instance, there may exist a left source of reflected light and a right source of reflected light, which need to be detected simultaneously. When the left and right sources of the reflected light are aligned after converge by lens 214, it is expected that the two photodetectors are also precisely aligned for detecting the two sources of light. That is, the respective photosensors (e.g., 512-1 and 512-2) in the two photodetectors need to be matched or well-aligned to ensure accurate detection of the two sources of reflected light simultaneously. The machines used for conventional PCB fabrication do not offer alignment control as good as the machines used for the fabrication process of the package. Therefore, if two photodetectors are fabricated through the PCB process, they may not align well enough to allow the accurate detection of the two sources of reflected light simultaneously. However, if using copackage design, the two photodetectors may be aligned in a single package with high precision, and thus can be used for detecting two sources of reflected light simultaneously with high efficiency and accuracy. For instance, as illustrated in the figure, the two photodetectors 520-1 and 520-2 can be precisely disposed to have an exact distance d1 between them. The distance d1 can be very small, e.g., only 210 um, which is very difficult to achieve if using the conventional PCB technique. It is to be noted that the precisely controlled distance d1 is not limited to the number provided in the example, and can be other distances smaller or larger than 210 um.

In some embodiments, for different application purposes, the multiple pairs of photodetectors and readout circuits in copackaged frontend may be organized in different formats. For instance, the multiple pairs of photodetectors and readout circuits may be aligned in a one-dimensional, two-dimensional, or three-dimensional array. The alignment between the two pairs of photodetectors and readout circuits in FIG. 5 may be viewed as a two-dimensional array, as the two photodetectors are aligned side-by-side in the center of copackaged frontend 516, while the two readout circuits are disposed on two sides of photodetectors 520-1 and 520-2. For a one-dimensional array, the multiple photodetectors may be aligned in a row, with the corresponding readout circuits disposed on the same side (not shown in the figure) of the multiple photodetectors. For a three-dimensional array, the multiple photodetectors may be stacked so that one photodetector is above another photodetector with respect to the substrate of the copackaged frontend. If the photodetectors are stacked (not shown in the figure), the corresponding readout circuits may be also aligned by stacking. Alignment may allow the bonding wires between the corresponding photodetectors and readout circuits to remain a short distance.

It is to be noted that, while the pairs of photodetectors and readout circuits discussed above have a one-to-one correspondence, in some embodiments, more than photodetectors may correspond to one readout circuit. For instance, in one application scenario, there may exist only one readout circuit for two photodetectors. In this embodiment, a switch and/or one or more intermediate bonding pads may be used to control the routing of bonding wires within the copackaged frontend and to control signal transmission between the single readout circuit and the two photodetectors. Consistent with the present disclosure, combinations of other numbers of photodetectors and readout circuits are also possible and thus are contemplated, as long as the general wirebonding rules are followed in routing the bonding wires between the photodetector(s) and the readout circuit(s). The general wire bonding rules to be applied may include: 1) choosing thick bonding wires to reduce resistance, 2) minimizing bonding wire length to reduce inductance, 3) no ground fill underneath bonding wires to reduce capacitance, etc.

Figure 6:
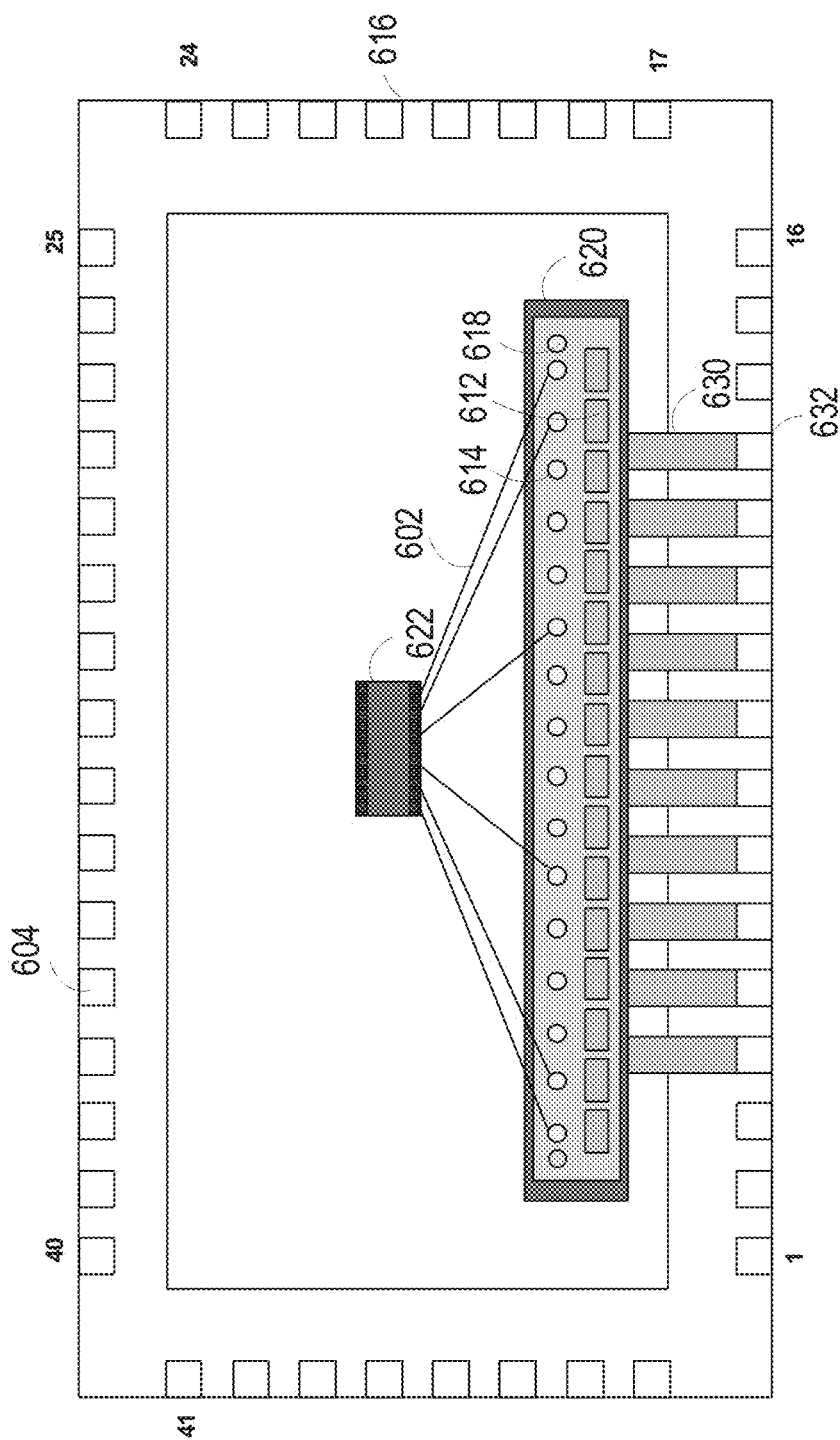
FIG. 6 illustrates a schematic diagram of an exemplary top plan view of a copackaged frontend of a receiver, according to embodiments of the disclosure.
Figure 7:
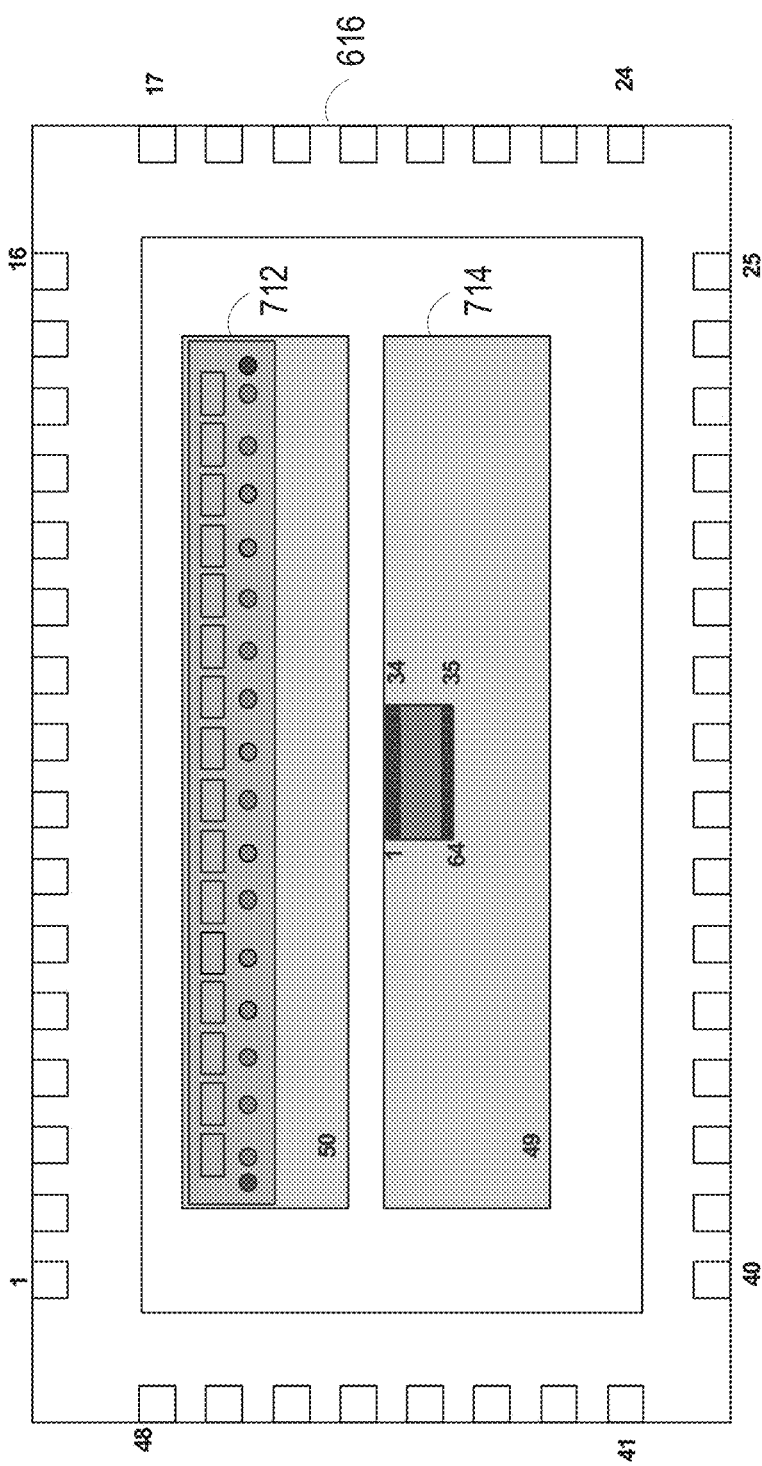
FIG. 7 illustrates a schematic diagram of an exemplary bottom plan view of a copackaged frontend of a receiver, according to embodiments of the disclosure.

After describing different structural components and different configurations of copackaged frontends in FIGS. 3-5, a more general top plan view and bottom plan view of one exemplary copackage receiver is further illustrated in FIGS. 6-7.

FIG. 6 illustrates a schematic diagram of an exemplary top plan view of a copackaged frontend, according to embodiments of the disclosure. As illustrated in the figure, from the top plan view, copackaged frontend 616 of a receiver of an optical sensing system includes photodetector 620 and readout circuit 622 and a plurality of bonding wires 602 directly connecting photodetector 620 with readout circuit 622. In photodetector 620, there exist a plurality of photodetecting elements 612, a corresponding number of circled bonding pads 614, and a couple of ground bonding pads 618. In addition, there may exist a number of bonding pads 630 for connecting photodetector 620 with a certain number (e.g., 10) of anode pins 632. Besides anode pins 632, copackaged frontend 616 may include a certain number of other package pins 604 for connecting with readout circuit 622 or with components of the optical sensing system external to copackaged frontend 616. The top side of copackaged frontend 616 may include other essential and non-essential components that are not specifically illustrated in the figure.

FIG. 7 illustrates a schematic diagram of an exemplary bottom plan view of copackaged frontend 616, according to embodiments of the disclosure. As illustrated, the backside or the bottom side of copackaged frontend 616 may include two ground pads 712 and 714 corresponding to the two components (i.e., photodetector 620 and readout circuit 622) on the front side or top side of copackaged frontend 616. The two ground pads 712 and 714 may short to other ground routings on the package substrate. That is, the ground bonding pads in the components in copackaged frontend 616 may connect to the ground pads 712 and 714. For instance, two ground bonding pads 618 on two sides of photodetector 620 may be connected to ground pad 712, and two ground bonding pads on two sides of readout circuit 622 may be connected to ground pad 714. Other ground pins (e.g., ground pins on the edges of the package substrate) may also be connected to ground pad 712 and/or ground pad 714. The bottom side of copackaged frontend 616 may include other components that are not specifically illustrated in FIG. 7.

The above descriptions in FIGS. 3-7 illustrate one way of integrating readout circuit with photodetector in a LiDAR system, which can be considered as a two-dimensional (2D) integration (may also be referred to as a "2D structure"). However, the present disclosure is not limited to such integration of photodetector with readout circuit. According to some embodiments, the photodetector and the readout circuit may be integrated into a 2.5 dimensional (2.5D) structure or in a three-dimensional (3D) structure. FIGS. 8B-8C illustrate exemplary 2.5D and 3D structures of photodetector and readout circuit integration, according to embodiments of the present disclosure. For illustration purposes, a 2D structure of copackaged frontend is also briefly illustrated in FIG. 8A.

FIG. 8A illustrates an exemplary 2D structure of a copackaged frontend, according to embodiments of the present disclosure. As illustrated in FIG. 8A, the exemplary 2D structure of a copackaged frontend includes substrate 810a that holds photodetector 820a and readout circuit 822a together on the substrate. One or more bonding wires 802a connect photodetector 820a with readout circuit 822a without intermediate pads. Additionally, one or more bonding wires 802b further connect readout circuit 822 to substrate 810a (e.g., surrounding pins on substrate 810a), as previously discussed.

FIG. 8B illustrates an exemplary 2.5D structure of a copackaged frontend, according to embodiments of the present disclosure. As illustrated, in a 2.5D structure, photodetector 820b is not directly connected to readout circuit 822b through bonding wires as shown in a 2D structure. Instead, photodetector 820b and readout circuit 822b flip chip side-by-side on silicon interposer 812. Silicon interposer 812 may contain complex electrical paths and circuits that re-route and/or re-characterize signals transmitted between photodetector 820b and readout circuit 822b. In addition, Through Silicon Vias (TSVs) 814a/814b, or other pillar-like structures, may be disposed within interposer 812 or between interposer 812 and photodetector 820b/readout circuit 822b, to provide the connection between photodetector 820b/readout circuit 822b and interposer 812. TSVs are high-performance interconnects made of a pillar-like structure with copper, tungsten, or poly through silicon that provides electrical interconnects through a silicon die or through-wafer. Besides pillar-like TSVs, a variety of bumps, including micro solder bumps, flip chip bumps, and the like, may also be configured to facilitate the interactions between photodetector 820b/readout circuit 822b and interposer 812.

In some embodiments, to allow photodetector 820b to receive returned optical signal while also interacting with interposer 812, photodetector 820b may have different configurations when compared to photodetector 820a. That is, photodetecting elements (i.e., photosensors) in photodetector 820b may face away from interposer 812, while bonding pads (or other similar components for communications) may face toward interposer 812. This is different from the configuration for photodetector 820a, in which both photodetecting elements and bonding pads may face away from substrate 810a.

In some embodiments, interposer 812 for connecting photodetector 820b and readout circuit 822b may be mounted on substrate 810b. For instance, interposer 812 may be mounted on substrate 810b through a Ball Grid Array (BGA) 818. Other approaches for permanently mounting interposer 812 over substrate 810b are also contemplated. In some embodiments, interposer 812 may itself serve as a substrate, so that there is no substrate 810b and the corresponding mounting mechanism(s) (e.g., BGA 818) for mounting interposer 812 on substrate 810b.

FIG. 8C illustrates an exemplary 3D structure of a copackaged frontend, according to embodiments of the present disclosure. In a 3D structure, photodetector and readout circuit are stacked over one another. In one application, photodetector 820c may be flipped onto readout circuit 822c, as photodetector 820c may need to stay on the top for photosensing/photodetection. Similar to a 2.5D structure, photodetector 820c and readout circuit 822c in a 3D structure may also interact with each other through TSVs 814c or other pillar-like structures. Similarly, a variety of bumps may also be involved in the interaction between photodetector 820c and readout circuit 822c.

In some embodiments, readout circuit 822c may be directly mounted onto substrate 810c. Accordingly, one or more bonding wires 802c may set up a connection between readout circuit 822c and pins (not shown) surrounding substrate 810c. In some embodiments, an interposer (not shown) may also be involved in the mounting of stacked photodetector 820c/readout circuit 822c onto substrate 810c, as previously discussed with reference to a 2.5D structure in FIG. 8B. If implemented this way, no bonding wires may be needed since the interposer may contain complex electrical paths and circuits for signal re-routing and/or re-characterization.

In some embodiments, there may be more than one pair of photodetector and readout circuit in actual applications, as previously discussed with respect to a copackaged frontend with a 2D structure. Accordingly, the 2.5D or 3D integrated photodetectors and readout circuits may also be aligned in a one-dimensional, two-dimensional, or even three-dimensional array, as previously discussed for 2D integrated photodetectors and readout circuits. For instance, for a 2.5D structure of photodetector and readout circuit integration, a plurality of pairs of photodetectors and readout circuits may be integrated onto a same interposer in a one-dimensional or two-dimensional array. Similarly, for a 3D structure of photodetector and readout circuit integration, a plurality of pairs of integrated photodetectors and readout circuits may be mounted onto a same substrate or interposer in a one-dimensional or two-dimensional array. The organization of a plurality of pairs of 3D integrated photodetectors and readout circuits in a three-dimensional array may also be feasible if photodetecting areas of the photodetectors are properly aligned during layer-by-layer stacking.

A 2.5D or 3D structure of photodetector and readout circuit integration may provide further advantages for a copackaged frontend. For instance, a 2.5D/3D structure may further increase integration density beyond Moore's Law, and offers the potential to significantly reduce interconnect delays and improve the system performance of a copackaged frontend. In addition, the shortened wire length may also lessen the power consumption of the copackaged frontend. A 2.5D/3D structure may also provide a flexible way to carry out the heterogeneous System-on-Chip (SoC) design by integrating disparate technologies onto different dies of a copackaged frontend with a 2.5D/3D structure. Other advantages and benefits become obvious when implemented in actual applications.

Figure 9:
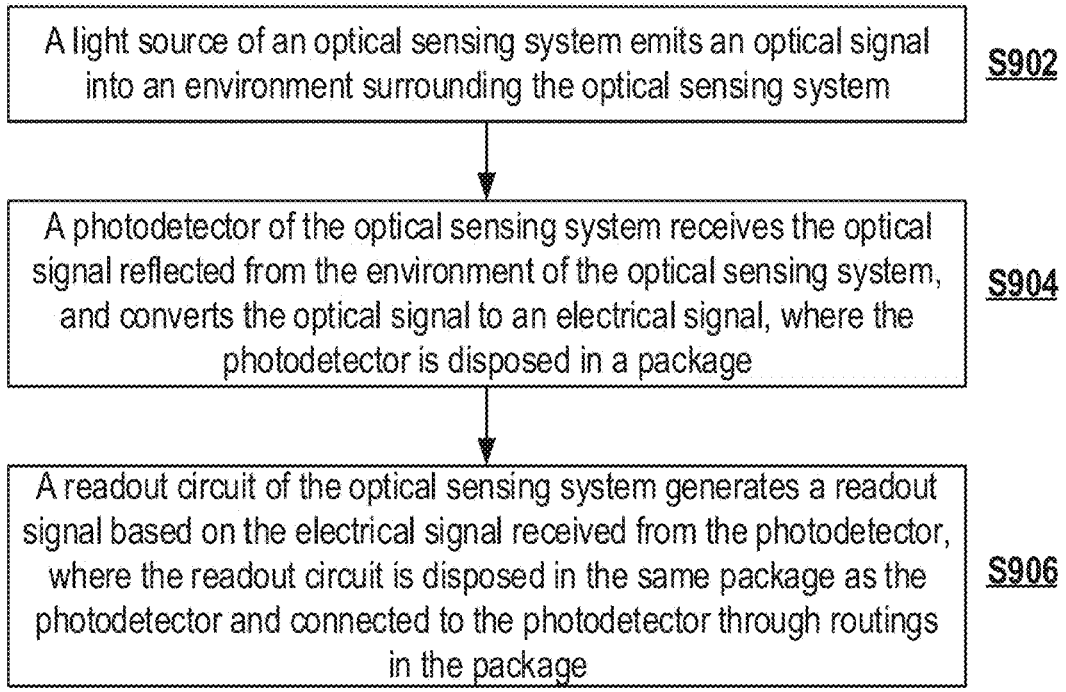
FIG. 9 is a flow chart of an exemplary method for signal detection of a LiDAR system with a copackaged frontend, according to embodiments of the disclosure.

Referring now to FIG. 9, a flow chart of an exemplary method for signal detection of a LiDAR system with a copackaged frontend of a receiver is provided, according to embodiments of the disclosure. In some embodiments, method 900 may be performed by various components of LiDAR system 102, e.g., transmitter 202, receiver 204 with copackaged frontend 216, and controller 206. In some embodiments, method 900 may include steps S902-S906. It is to be appreciated that some of the steps may be optional. Further, some of the steps may be performed simultaneously, or in a different order than that shown in FIG. 9.

In step S902, optical signals may be emitted by a light source of an optical sensing system (e.g., transmitter 202 of LiDAR system 102). The optical signal is emitted into the environment surrounding the optical sensing system. For instance, transmitter 202 of LiDAR system 102 may sequentially emit a stream of nanosecond beams in different directions within a scanning range (e.g., a range in angular degrees, such as 20 degrees, 40 degrees, etc.), as illustrated in FIG. 2. The stream of beams are reflected from one or more objects within the scanning range in the environment.

In step S904, a photodetector of the optical sensing system (e.g., photodetector 220 of LiDAR system 102) receives an optical signal reflected from the environment of the optical sensing system, and converts the optical signal to an electrical signal. As discussed elsewhere herein, the photodetector is disposed in a package (e.g., on a substrate of the package) as a part of a copackaged frontend of the receiver of the optical sensing system. The photodetector may convert the reflected optical signal into an electrical signal, which may be an electrical current or electrical voltage. The generated electrical signal is proportional to the intensity of the light striking the photodetector. The generated electrical signal may be not readable by a controller of the optical sensing system (e.g., controller 206), and thus is first processed by a readout circuit (e.g., readout circuit 222 of LiDAR system 102) in the system.

In step S906, the readout circuit of the optical sensing system generates a readout signal based on the electrical signal received from the photodetector of the optical sensing system. Depending on the configurations, the readout circuit may convert the electrical signal (e.g., electrical current) received from the photodetector into a signal (e.g., a digital signal) that is readable by the controller (e.g., controller 206) of the optical sensing system. The controller of the optical sensing system may further process the received signal, including constructing a dynamic high-definition map or 3-D buildings and city modeling, among others.

As discussed elsewhere herein, the readout circuit is disposed in the same package as the photodetector, where the readout circuit and the photodetector are directly connected through routings in the same package. These routings may include one or more bonding wires in a 2D integration of photodetector(s) and readout circuit(s), or include TSAs, an interposer, and/or a variety of bumps in a 2.5D/3D integration of photodetector(s) and readout circuit(s). Therefore, during signal transmission, the photodetector may directly transmit the electrical signal to the readout circuit through the routings in the same package without going through any PCB structure or similar configurations. Since there is no copper traces or other PCB structures required in the connection as shown in other existing LiDAR systems, the routings for connecting photodetector(s) and readout circuit(s) for the disclosed LiDAR system may be shortened as much as possible. Accordingly, parasitic capacitance and inductance and thus the overall noise of the system can be greatly reduced. In addition, for the multi-channel photodetector/readout circuit design that includes a plurality of photodetectors and readout circuits in the system, due to the copackaging design in a single package, the plurality of photodetectors and readout circuits can be tightly controlled in the alignment to reduce routing mismatch between different channels, thereby avoiding the problem of detection (e.g., gain and bandwidth) mismatch among different channels. The overall performance of the disclosed LiDAR system is thus improved.

Although the disclosure is made using a LiDAR system as an example, the disclosed embodiments may be adapted and implemented to other types of optical sensing systems that use receivers to receive optical signals not limited to laser beams. For example, the embodiments may be readily adapted for optical imaging systems or radar detection systems that use electromagnetic waves to scan objects.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

The invention claimed is:
1. An optical sensing system, comprising:
   a light source configured to emit an optical signal into an environment surrounding the optical sensing system;
   a photodetector configured to receive the optical signal reflected from the environment of the optical sensing system, and convert the optical signal to an electrical signal, the photodetector being disposed in a substrate;

a readout circuit configured to generate a readout signal based on the electrical signal received from the photodetector, the readout circuit being disposed in the same substrate as the photodetector and connected to the substrate through one or more bonding, wherein the photodetector and the readout circuit are stacked over one another, and are connected through one or more through silicon vias (TSVs) in a three-dimensional (3D) structure.

2. The optical sensing system of claim 1, wherein the photodetector comprises one or more of an avalanche photodetector (APD), a p-i-n (PIN) detector, a single photon avalanche diode (SPAD) detector, or a silicon photo multiplier (SiPM) detector.

3. The optical sensing system of claim 1, wherein the substrate comprises a plurality of photodetectors aligned in a one-dimensional, two-dimensional, or three-dimensional array.

4. The optical sensing system of claim 3, wherein the substrate comprises a plurality of readout circuits aligned in the one-dimensional, two-dimensional, or three-dimensional array, and each of the plurality of readout circuits is coupled to a respective one of the plurality of photodetectors.

5. The optical sensing system of claim 3, wherein more than one photodetector is coupled to a single readout circuit.

6. The optical sensing system of claim 1, wherein the readout circuit comprises one or more of a trans-impedance amplifier (TIA), analog-to-digital converter (ADC), and time-to-digital converter (TDC).

7. The optical sensing system of claim 1, wherein the substrate comprises two photodetectors disposed at a predefined distance therebetween, and wherein the predefined distance is adjustable according to one or more routing rules.

8. An optical sensing method, comprising:

emitting, by a light source of an optical sensing system, an optical signal into an environment surrounding the optical sensing system;

receiving, by a photodetector of the optical sensing system, the optical signal reflected from the environment surrounding the optical sensing system, wherein the photodetector is disposed in a substrate; and generating, by a readout circuit of the optical sensing system, a readout signal based on an electrical signal received from the photodetector, wherein the readout circuit is disposed in the same substrate as the photodetector and connected to the substrate through one or more bonding wires, and wherein the photodetector and the readout circuit are stacked over one another on the substrate, and are connected through one or more through silicon vias (TSVs) in a three-dimensional (3D) structure.

9. The optical sensing method of claim 8, wherein the substrate comprises a plurality of photodetectors aligned in a one-dimensional, two-dimensional, or three-dimensional array.

10. The optical sensing method of claim 9, wherein the substrate comprises a plurality of readout circuits aligned in the one-dimensional, two-dimensional, or three-dimensional array, and each of the plurality of readout circuits is coupled to a respective one of the plurality of photodetectors.

11. The optical sensing method of claim 10, wherein more than one photodetector is coupled to a single readout circuit.

12. The optical sensing method of claim 8, wherein the substrate comprises two photodetectors disposed at a predefined distance therebetween, and wherein the predefined distance is adjustable according to one or more routing rules.

13. A copackaged frontend of a receiver for an optical sensing system, comprising:

a photodetector configured to receive an optical signal and convert the optical signal to an electrical signal; and a readout circuit configured to generate a readout signal based on the electrical signal received from the photodetector, wherein the photodetector and the readout circuit are disposed in a same substrate and the substrate is connected to the readout circuit through one or more bonding wires, and wherein the photodetector and the readout circuit are stacked over one another on the substrate, and are connected through one or more through silicon vias (TSVs) in a three-dimensional (3D) structure.

14. The copackaged frontend of the receiver according to claim 13, wherein the substrate comprises a plurality of photodetectors aligned in a one-dimensional, two-dimensional, or three-dimensional array and a plurality of readout circuits aligned in the one-dimensional, two-dimensional, or three-dimensional array, and each of the plurality of readout circuits is coupled to a respective one of the plurality of photodetectors.

* * * * *